(12) United States Patent
Maijala (10) Patent No.: US 9,773,743 B2
(45) Date of Patent: Sep. 26, 2017

(54) VERSATILE AND RELIABLE INTELLIGENT PACKAGE

(71) Applicant: STORA ENSO OYJ, Helsinki (FI)

(72) Inventor: Juha Maijala, Espoo (FI)

(73) Assignee: STORA ENSO OYJ, Helsinki (FI)

( * ) Notice: Subject to any disclaimer, the term of this patent is extended or adjusted under 35 U.S.C. 154(b) by 0 days.

(21) Appl. No.: 14/430,173

(22) PCT Filed: Sep. 23, 2013

(86) PCT No.: PCT/FI2013/050916
§ 371 (c)(1),
(2) Date: Mar. 20, 2015

(87) PCT Pub. No.: WO2014/044918
PCT Pub. Date: Mar. 27, 2014

(65) Prior Publication Data
US 2015/0249059 A1     Sep. 3, 2015

(30) Foreign Application Priority Data

Sep. 21, 2012 (FI) .................................. 20125979

(51) Int. Cl.
*H01L 23/66* (2006.01)
*A61J 1/03* (2006.01)
(Continued)

(52) U.S. Cl.
CPC ............. *H01L 23/66* (2013.01); *A61J 1/035* (2013.01); *B65D 25/00* (2013.01);
(Continued)

(58) Field of Classification Search
CPC .... H05K 1/0292; H05K 3/0052; H05K 1/165; H05K 1/111; H05K 2201/09254;
(Continued)

(56) References Cited

U.S. PATENT DOCUMENTS 6,628,199 B1    9/2003  Ehrensvärd et al.
7,113,101 B2 *  9/2006  Petersen ............... A61J 1/035
                                                340/590
(Continued)

FOREIGN PATENT DOCUMENTS

CA       2353350 A1     1/2003
CN     102208903 A     10/2011
(Continued)

OTHER PUBLICATIONS

International Search Report issued in PCT/FI2013/050916, dated Feb. 24, 2014.
(Continued)

*Primary Examiner* — An T Nguyen
(74) *Attorney, Agent, or Firm* — Birch, Stewart, Kolasch & Birch, LLP (57) ABSTRACT

A package comprises a body, and an electrically conductive pattern supported by said body. An interface portion is configured to receive a module to a removable attachment with the package. The electrically conductive pattern comprises, at least partly within said interface portion, a wireless coupling pattern that constitutes one half of a wireless coupling arrangement.

15 Claims, 7 Drawing Sheets

(51) Int. Cl.
*B65D 25/00* (2006.01)
*H05K 3/30* (2006.01)
*H01L 23/498* (2006.01)
*H01L 23/00* (2006.01)
*H01L 23/58* (2006.01)
*H01L 23/64* (2006.01)
*H05K 1/02* (2006.01)
*H05K 1/11* (2006.01)
*H05K 1/16* (2006.01)
*H05K 3/00* (2006.01)

(52) U.S. Cl.
CPC ........ *H01L 23/4985* (2013.01); *H01L 23/564* (2013.01); *H01L 23/585* (2013.01); *H01L 23/642* (2013.01); *H01L 23/645* (2013.01); *H05K 1/028* (2013.01); *H05K 1/0239* (2013.01); *H05K 1/0275* (2013.01); *H05K 1/0292* (2013.01); *H05K 3/301* (2013.01); *A61J 2200/30* (2013.01); *A61J 2205/60* (2013.01); *B65D 2203/10* (2013.01); *H01L 2924/0002* (2013.01); *H05K 1/0216* (2013.01); *H05K 1/111* (2013.01); *H05K 1/165* (2013.01); *H05K 3/0052* (2013.01); *H05K 3/303* (2013.01); *H05K 3/305* (2013.01); *H05K 2201/053* (2013.01); *H05K 2201/056* (2013.01); *H05K 2201/0909* (2013.01); *H05K 2201/09045* (2013.01); *H05K 2201/0999* (2013.01); *H05K 2201/09127* (2013.01); *H05K 2201/09254* (2013.01); *H05K 2201/09263* (2013.01); *H05K 2201/09954* (2013.01); *H05K 2201/2036* (2013.01); *H05K 2203/0195* (2013.01); *H05K 2203/0228* (2013.01)

(58) Field of Classification Search
CPC . H05K 2201/09045; H05K 2201/09263; A61J 1/035; B65D 2203/10; H01L 23/645; H01L 23/66; H01L 23/642; H01L 2924/0002; H01L 23/585; H01L 23/4985
See application file for complete search history.

(56) References Cited

U.S. PATENT DOCUMENTS

| | | | |
|---|---|---|---|
| 7,170,409 B2 | 1/2007 | Ehrensvärd et al. | |
| 7,178,417 B2* | 2/2007 | Petersen | A61J 7/0481 73/865.8 |
| 7,748,636 B2* | 7/2010 | Finn | G06K 7/0008 235/375 |
| 9,101,530 B2* | 8/2015 | Wilson | A61J 1/035 |
| 2002/0170960 A1* | 11/2002 | Ehrensvard | G06Q 20/10 235/380 |
| 2005/0012616 A1* | 1/2005 | Forster | G06K 19/0717 340/572.7 |
| 2006/0061472 A1* | 3/2006 | Lovoi | A61J 3/007 340/572.1 |
| 2006/0109123 A1* | 5/2006 | Carrender | G06K 19/0723 340/572.1 |
| 2006/0109130 A1* | 5/2006 | Hattick | G06K 19/045 340/572.7 |
| 2006/0152364 A1* | 7/2006 | Walton | B65D 55/028 340/568.1 |
| 2007/0001005 A1* | 1/2007 | White | B23Q 1/0009 235/451 |
| 2007/0084746 A1 | 4/2007 | Udo et al. | |
| 2007/0246396 A1* | 10/2007 | Brollier | A61J 1/035 206/534 |
| 2008/0303665 A1 | 12/2008 | Naik et al. | |
| 2009/0121030 A1* | 5/2009 | Kato | G06K 19/07749 235/492 |
| 2009/0194452 A1* | 8/2009 | Hession | A61J 1/035 206/531 |
| 2009/0201117 A1 | 8/2009 | Kato et al. | |
| 2009/0277815 A1* | 11/2009 | Kohl | A61J 1/035 206/531 |
| 2009/0294521 A1* | 12/2009 | de la Huerga | A61J 1/035 235/375 |
| 2010/0007501 A1* | 1/2010 | Yang | B01L 3/545 340/572.8 |
| 2010/0066509 A1 | 3/2010 | Okuizumi et al. | |
| 2011/0241793 A1 | 10/2011 | Frye et al. | |
| 2013/0222135 A1* | 8/2013 | Stein | A61J 7/0409 340/540 |
| 2013/0285681 A1* | 10/2013 | Wilson | G01N 27/00 324/693 |
| 2014/0048442 A1* | 2/2014 | Maijala | B65D 75/327 206/534 |
| 2014/0052467 A1* | 2/2014 | Maijala | A61J 1/035 705/2 |
| 2015/0164741 A1* | 6/2015 | Wilson | A61J 1/035 206/531 |
| 2015/0249059 A1* | 9/2015 | Maijala | A61J 1/035 257/664 |
| 2016/0103085 A1* | 4/2016 | Mehregany | H05K 7/02 324/71.1 |

FOREIGN PATENT DOCUMENTS

| | | |
|---|---|---|
| EP | 1 758 050 A1 | 2/2007 |
| EP | 2 290 926 A2 | 3/2011 |
| WO | WO 98/36727 A1 | 8/1998 |
| WO | WO 02/093881 A2 | 11/2002 |
| WO | WO 02/095675 A1 | 11/2002 |
| WO | WO 2005/123186 A1 | 12/2005 |
| WO | WO 2006/076806 A1 | 7/2006 |
| WO | WO 2008/000279 A1 | 1/2008 |
| WO | WO 2008/014489 A2 | 1/2008 |
| WO | WO 2011/161299 A1 | 12/2011 |
| WO | WO 2012/055021 A1 | 5/2012 |
| WO | WO 2012/110700 A1 | 8/2012 |

OTHER PUBLICATIONS

Written Opinion of the International Searching Authority issued in PCT/FI2013/050916, dated Feb. 24, 2014.
Chinese Office Action and Chinese Search Report, issued Sep. 7, 2016, for Chinese Application No. 201380059823.5, along with a partial English translation of the Chinese Office Action.
Supplementary European Search Report, dated Mar. 18, 2016, for corresponding European Application No. 13 83 8256.

* cited by examiner

Fig. 18

VERSATILE AND RELIABLE INTELLIGENT PACKAGE

TECHNICAL FIELD

The invention concerns in general the technology of intelligent packages. In particular the invention concerns a versatile and reliable way of implementing an interface between a package portion and a communications module.

BACKGROUND

The term intelligent package generally refers to a package that can electronically store, log, and/or reveal information about one or more products contained in the package. Package-borne intelligence can also store, log, and/or reveal information about how the package has been handled in a delivery chain. A simple example of an intelligent package is one equipped with an RFID (Radio Frequency IDentification) tag.

More elaborate examples of intelligent packages are known for example from the patent publication WO 2011/161299. It introduces the idea of attaching a communications module to a package, such as a consumer package of pharmaceuticals. The package, which may take for example the form of a blister sheet for individual pills, comprises conductive tracks that constitute some simple electric circuitry. When the communications module is attached to the package, an interface section of the module makes contact with conductive patches on the package, so that the module can notice changes that affect the state of said electric circuitry. As an example, if a patient removes a pill from the package by pushing it through the bottom layer of the blister sheet, the rupturing bottom layer may cut one or more conductive tracks, which the communications module notices as a change in the electric conductivity between certain conductive patches.

Despite its significant advantages, the technical solution described above leaves room for improvement, particularly relating to the interface between the package and the communications module. Concerning medical applications, patients may have for example visual or motoric disabilities that make it difficult for them to change the communications module from an exhausted package to a new one by themselves. Even if the task of attaching a communications module to a package was entrusted to trained personnel, the possibility of human error and even a simple thing like manufacturing tolerances may cause difficulties in making the combination function properly. In other kinds of applications the known solution may be considered inflexible in terms of limiting the design of the package.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

According to an aspect of the invention, there is provided a package that comprises a body, an electrically conductive pattern supported by said body, and an interface portion configured to receive a module to a removable attachment with said package. The electrically conductive pattern comprises, at least partly within said interface portion, a wireless coupling pattern that constitutes one half of a wireless coupling arrangement.

According to another aspect of the invention, there is provided a communications module for a package. The communications module comprises a module body and—at an outer surface of said module body—one or more wireless coupling patterns that constitute a half of a wireless coupling arrangement. The communications module further comprises a sensor of electric characteristics, said sensor being configured to direct an excitation signal to said half of a wireless coupling arrangement and to measure a response to said excitation signal.

According to yet another aspect of the invention, there is provided a package system comprising a package and a communications module of the above-described kind.

The approach of using a short-distance wireless communications link between the package and the communications module involves many advantages. The module may obtain information about changes in the package without a carefully completed mechanical connection between the two, which means less stringent requirements for the step where the module is attached to the package and looser tolerances in manufacturing. The package, the module, or both may comprise redundant means for setting up the short-distance wireless communications link at different locations, which allows using the same module with different kinds of packages, and which may also allow for degrees of freedom in the orientation that the module has in relation to the package. The means for setting up the short-distance communications link may be made so that they are not visible for an ordinary user, which gives more freedom to visual design and may lessen the distrust that some users feel against electronic gadgets or electricity in general.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF EXEMPLARY EMBODIMENTS OF THE INVENTION

Figure 1:
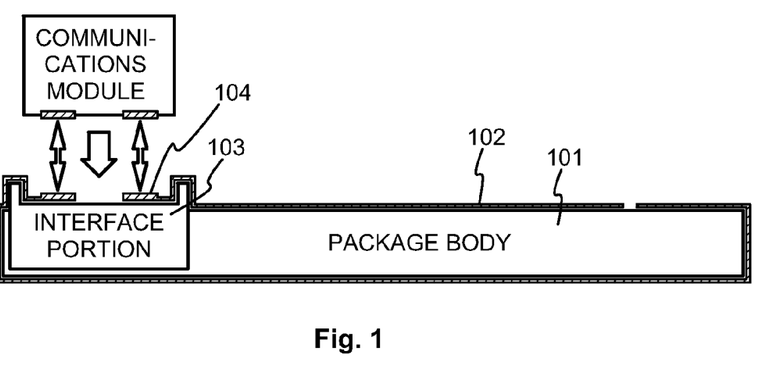
FIG. 1 illustrates a principle of setting up a short-distance wireless communications link between a package and a communications module.

According to the principle illustrated in FIG. 1, a package may comprise a body 101, which may also be called a package body, and an electrically conductive pattern 102 supported by the body 101. The material, form, size, structure, and other attributes of the body 101 are typically dictated to some extent by the product(s) that the package is designed to contain. The body 101 may support also other parts of the package, and the package may comprise subparts. As one example of a package we may consider a package for pharmaceuticals that come in the form of discrete individual pieces like pills or capsules. In that exemplary case the body 101 may consist of two layers of cardboard and a blister inlay that defines a number of compartments. The blisters protrude through openings in the top cardboard layer, and the bottom cardboard layer has correspondingly placed openings or weaker spots through which the pills or capsules can be released. Pressing a protruding compartment forces the pill or capsule contained therein downwards, until it ruptures the layer beneath it and falls out.

The electrically conductive pattern 102 may be for example a pattern that has been produced on one surface of the body 101 with a printing method, like inkjet printing, offset printing, or flexo printing. Techniques that enable printing electrically conductive patterns on surfaces are known for example from patent publication WO2009/135985 and from patent applications FI 20125088 and FI 20125090, which at the time of writing this description are not yet available to the public. Alternatively the electrically conductive pattern 102 may be for example a piece of metal foil laminated onto a surface or into the structure of the body 101, or a pattern that has been formed with a thin film manufacturing technique, like pulsed laser deposition. The electrically conductive pattern 102 does not need to constitute the outermost layer or a visible part on a surface of the body, but that is neither excluded by the invention.

The package comprises an interface portion 103 that is configured to receive a module to a removable attachment with the package. The way in which the interface portion 103 is configured to receive a module involves considerable freedom. Taken that—in a way that will be described in more detail later—there will be established a short-range communications link between the two, the interface portion 103 should comprise certain free space where no structural feature of the package obstructs the module from coming to a relatively close contact with a portion of a surface (which may be an inner or outer surface) of the package. Taken that it is advantageous that—once attached—the module remains relatively stationary with respect to the package, the interface portion 103 should comprise and/or should allow easily adding some attachment forms, like side walls that keep the module from moving sideways on the surface of the package. The interface portion 103 may also comprise and/or may allow easily attaching some covering form or forms that keep the module from being detached from the package. The interface portion 103 may also comprise some (tacky) adhesive, tape, or other attaching means such as one half of a hook-and-loop type attachment band for (removably) holding the module in place with respect to the package.

The interface portion 103 is also used to set up a short-range wireless communications link between the package and the module. Therefore the electrically conductive pattern 102 comprises, at least partly within the interface portion 103, a wireless coupling pattern 104 that constitutes one half of a wireless coupling arrangement. The corresponding other half of the wireless coupling arrangement is located in the module that is to be received by the interface portion 103. When the module has been received in the interface portion 103, the halves of the wireless coupling arrangement come close enough to each other so that an electric signal can be conveyed over it. According to an embodiment of the invention the wireless coupling pattern 104 is either a capacitive coupling patch or an inductive coupling loop that is located within or extends into the interface portion 104 as a galvanically coupled extension of the electrically conductive pattern 102.

Figure 2:
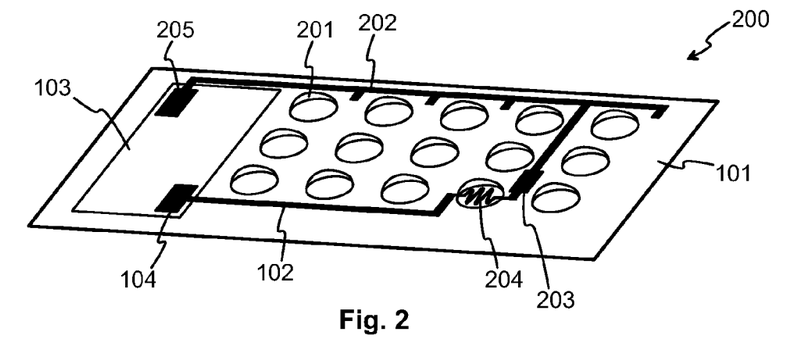
FIG. 2 illustrates patches and tracks on a surface of a package.

FIG. 2 illustrates one possible practical embodiment of the principle that was schematically described above with reference to FIG. 1. The body 101 of the package 200 is generally planar in form and defines individual, blister-formed compartments, of which compartment 201 is shown as an example. The interface portion 103 is a portion of the planar surface of the package body where no blister-formed compartments appear. The package may comprise at least as many electrically conductive patterns as there are compartments, but to maintain graphical clarity FIG. 2 illustrates only one electrically conductive pattern 102 as well as a ground track 202, which both are here printed patterns on the surface of the body 101 that is visible in the drawing.

The wireless coupling pattern 104 is a capacitive coupling patch at that end of the electrically conductive pattern 102 that reaches into the interface portion 103. At the other end of the electrically conductive pattern 102 is an impedance element 203 that is coupled between the electrically conductive pattern 102 and the ground track 202. A breakable portion 204 of the electrically conductive pattern 102 is located along it, i.e. between the wireless coupling pattern 104 and the impedance element 203, so that a direct electric connection between the wireless coupling pattern 104 and the impedance element 203 only exists as long as the breakable portion 204 is intact. The location and form of the breakable portion 204 have been selected so that releasing the contents of one of the compartments would be difficult or impossible without breaking the breakable portion 204. In the embodiment of FIG. 2 this means that the breakable portion 204 is a section of the electrically conductive pattern 102 that meanders back and forth across that portion of a bottom layer that closes one of the compartments.

In the embodiment of FIG. 2 the ground track 202 is supported by the body 101 in the same way as the electrically conductive pattern 102. It comprises a ground coupling pattern 205 that is located at least partly within the interface portion 103. In FIG. 2 we assume that the ground coupling pattern 205 is a capacitive coupling patch just like the wireless coupling pattern 104, and located at that end of the ground track 202 that reaches into the interface portion 103. The ground coupling pattern 104 is located at an opposite end of that part of the interface section 103 that is defined by the flat surface area of the body 101, in order to avoid electromagnetic interference phenomena between the two patches. Interference could occur as a result of stray capacitance and/or stray inductance between the two patches. The short stubs that are schematically shown as "side streets" of the ground track 202 remind of the fact that the same ground track may be coupled, through respective impedance elements, to all electrically conductive patterns, of which there are as many as there are compartments in the package.

Figure 3:
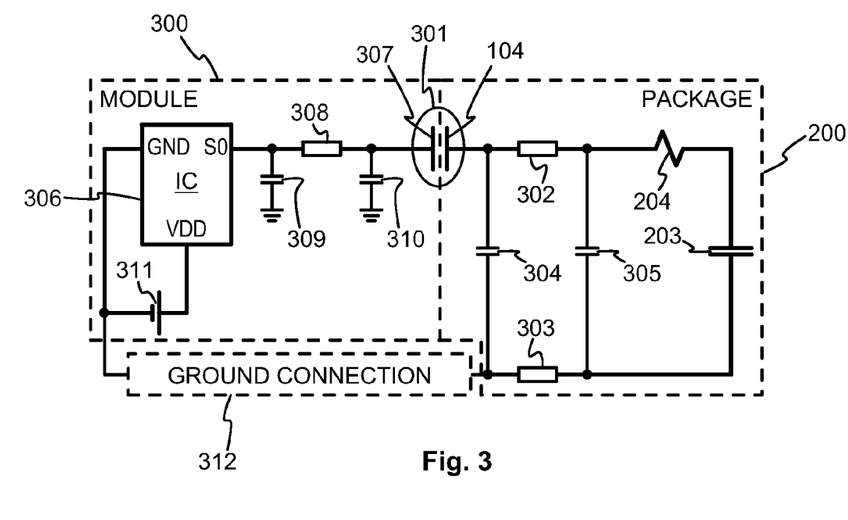
FIG. 3 illustrates an equivalent circuit of a sensor in a module and a track on a package.

FIG. 3 illustrates an equivalent circuit of a package 200 as illustrated in FIG. 2 coupled to a module 300. The impedance element 203 is a capacitance in the embodiment of FIG. 3, meaning that its impedance consists predominantly of capacitive reactance. The wireless coupling arrangement 301 that couples the electrically conductive pattern to the module 300 is a capacitive coupling, one half of which is the wireless coupling pattern (i.e. capacitive patch) 104 at one end of the electrically conductive pattern. Resistances of the electrically conductive pattern and the ground track are illustrated schematically with discrete resistors 302 and 303 respectively, and the stray capacitance between the electrically conductive pattern and the ground track is represented with the schematically shown capacitors 304 and 305. Inductances within the package 200 are assumed to be so small that they can be neglected in the equivalent circuit.

In FIG. 3 we assume that the module 300 comprises a sensor of electric characteristics, parts of which are an integrated circuit 306, a wireless coupling pattern 307 that constitutes the other half of the wireless coupling arrangement 301, and the electric coupling between them. The resistance of said electric coupling is schematically represented with the discrete resistor 308, and the stray capacitance between said electric coupling and ground is represented with the schematically shown capacitors 309 and 310. Said electric coupling is shown to connect with an S0 (signal input/output number zero) I/O lead of the integrated circuit 306, while a voltage source 311 is coupled to an operating voltage input of the integrated circuit 306 consisting of VDD and GND leads.

The integrated circuit 306 is a circuit that is configured to direct an excitation signal to its S0 I/O lead and therethrough to the wireless coupling pattern 307 that constitutes the other half of the wireless coupling arrangement 301. The circuit is also configured to measure a response to said excitation signal. For example, the integrated circuit 306 may be configured to direct an oscillating excitation signal to the wireless coupling pattern 307 that constitutes the other half of the wireless coupling arrangement 301, and configured to measure a frequency response to said oscillating excitation signal. Such an oscillating excitation signal may be produced with for example a low-frequency RC oscillator within the integrated circuit 306 in a manner known as such.

How the electric characteristics of the external circuitry coupled to the S0 I/O lead reacts to the oscillating excitation signal depends on the topology and characteristics of the external circuitry, as well as on the nature of the ground connection 312 that coupled the ground track of the package 200 to the zero potential level of the module 300.

In general, we may assume that some kind of a ground connection 312 exists. In that case the whole external circuitry (reference numbers 309, 308, 310, 307, 301, 104, 304, 302, 305, 204, 203, and 303) that constitutes the coupling from the S0 I/O lead (through ground connection 312) to the negative terminal of the battery 311 is coupled, as a whole, in parallel with the internal capacitor of the low-frequency RC oscillator within the integrated circuit 306. We assume that the impedance of said external circuitry is dominated by its capacitive reactance, so we may consider only the capacitances 203, 304, 305, 309, and 310 within the external circuitry. The larger the capacitance of said external circuitry, the lower the resonance frequency of the low-frequency RC oscillator.

If the external circuitry is cut at breaking point 204, the capacitance of the impedance element 203 is no more part of the overall capacitance of the external circuitry. This makes the overall capacitance significantly smaller, which in turn is noted within the integrated circuit 306 as an increase of the resonance frequency of the RC oscillator. Integrated circuits that are capable of this kind of detecting are widely available commercially; for example a circuit of the type EM6240 of EM Microelectronic, Marin, Switzerland can be used.

Figure 4:
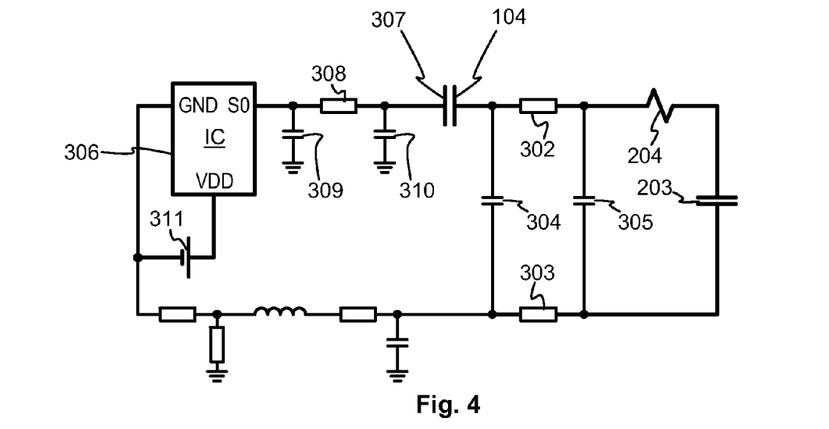
FIG. 4 illustrates an equivalent circuit in which the ground connection goes through a user.

FIG. 4 illustrates the equivalent circuit in a case where the formation of a ground connection is left to environmental factors, such as the hands of a human user who handles the package with its module attached. Such an "ad hoc" type ground connection may comprise various resistances, inductances, and capacitances, some of which are schematically shown as FIG. 4. In general, since the values of such resistances, inductances, and capacitances may vary greatly depending on e.g. whether the person in question wears gloves or not, it is not a recommendable way to implement the ground connection between the package and the module. It may come simply too difficult to predict the way and amount in which the measured electric characteristics change as a response to cutting the external circuitry at the breaking point 204, and as a consequence reliably detecting such an incident could become impossible.

Figure 5:
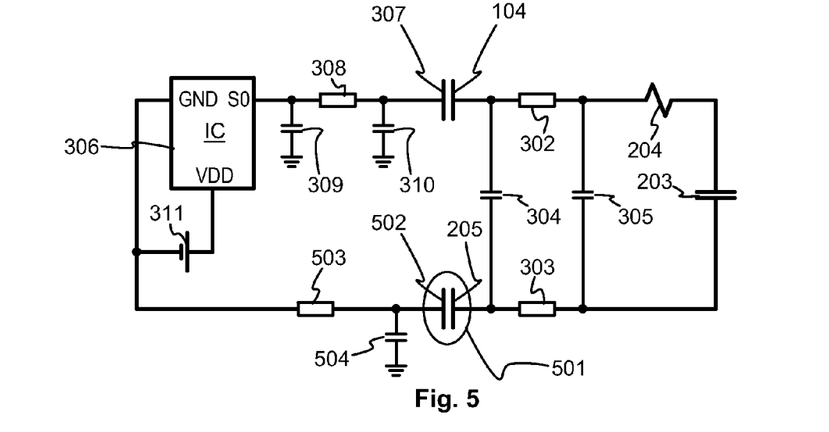
FIG. 5 illustrates an equivalent circuit in which the ground connection is capacitive.

FIG. 5 illustrates a case that is very much comparable to the embodiment of FIG. 2 in that a capacitive ground connection goes through a wireless coupling arrangement 501 consisting of coupling patterns 205 and 502 in the package and the module respectively. The connection from the module-borne coupling pattern 502 to the negative pole of the module-borne power source 311 has some resistance illustrated as 503, and there is some stray capacitance illustrated as 504 between it and the ground, but in general the impedance of the external current path between S0 and GND is dominated by the capacitive reactances of the upper and lower wireless coupling arrangements and the impedance element 203, which are coupled in series (if the stray capacitances 304 and 305 are neglected). If in such a case the circuit is cut at the breaking point 204, the external capacitance seen by the sensor of electric characteristics within the integrated circuit 306 decreases radically, which can be detected as a change in the frequency of the internal low-frequency RC oscillator.

Figure 6:
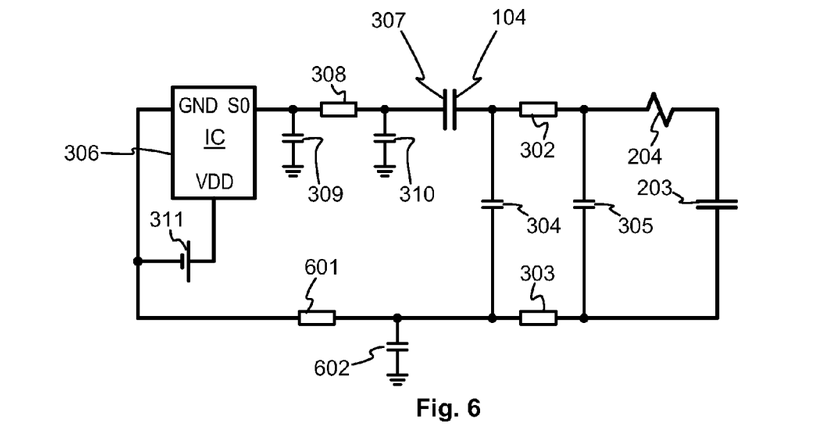
FIG. 6 illustrates an equivalent circuit in which the ground connection is galvanic.

FIG. 6 illustrates a case in which the ground connection is a galvanic connection. It can be implemented for example by forming electrically conductive regions both within the interface portion of the package and the outer surface of the module, and by taking care that these electrically conductive regions touch each other when the module is attached in place. There is still some resistance 601 in the ground connection, and some stray capacitance 602 to ground, but the impedance of the external circuitry is certainly heavily dependent on the capacitive reactance of the impedance element 203, so cutting the external circuitry at the breaking point 204 will be relatively easy to detect within the integrated circuit 306.

Figure 7:
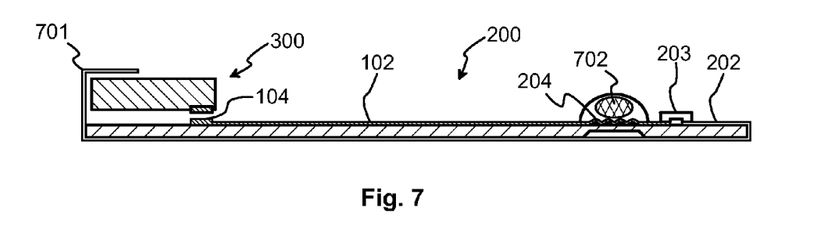
FIG. 7 illustrates an example of leading tracks to a module through various routes.

FIG. 7 is a partial cut-out diagram that demonstrates some possible technical solutions in a package system that comprises a package 200 and a module 300. The interface portion for receiving the module is located at that end of the package 200 that is to the left in FIG. 7. It comprises a bent portion 701 at the very end of the package body, constituting a pocket in which the module can be placed. An electrically conductive pattern 102 begins from a wireless coupling pattern 104 located within the interface portion and runs on a surface of the package body up to a breaking point 204 at a location where releasing a product 702 from the package is very likely to cut the electrically conductive pattern 102. Beyond the breaking point 204 the electrically conductive pattern 102 is coupled to a ground track 202 through an impedance element 203.

The ground track 202 continues on the other side of the package 200, where it extends up to the outer side of the interface portion. This enables placing the point, where coupling (either wireless or galvanic coupling) between the ground track and the module is made, relatively far from the points where the wireless "signal" connections are made (e.g. the location of wireless coupling pattern 104). Using quotes in "signal" connections is justified, because in order to properly detect the change in the electric characteristics of the electrically conductive pattern 102. i.e. to obtain a proper signal indicative of cutting the electrically conductive pattern at breaking point 204, the module 300 should be equipped not only with the "signal" connection but also with the ground connection.

In order to decrease the stray capacitance between the electrically conductive pattern 102 and the ground track 202 it is advantageous to keep the physical distance between them as large as possible. Therefore it is advisable that in a configuration like that of FIG. 7, where the ground track runs on the other side of the package, the ground track is located differently than the electrically conductive patterns on the other side. For example, if the electrically conductive patterns follow predominantly one edge of the package on its top side, the ground track may follow predominantly the other edge of the package on its bottom side.

Figure 8:
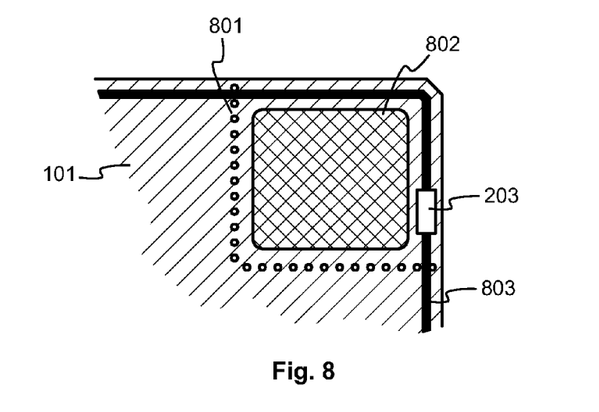
FIG. 8 illustrates one possible way of providing a breaking point.

Implementing the breaking point as a part of the electrically conductive pattern that extends across a breakable wall of a compartment defined by the package body is not the only possible way. FIG. 8 illustrates an alternative, in which the breakable portion extends across a perforation 801 of the body 101. Another feature of FIG. 8 that is an alternative to previously explained embodiments is the location of the impedance element 203 within a portion of the package that the user will remove in order to release a desired product 802. In the embodiment of FIG. 8, also the ground track 803 extends across the perforation 801 and will be severed at the time of releasing the product 802.

Figure 9:
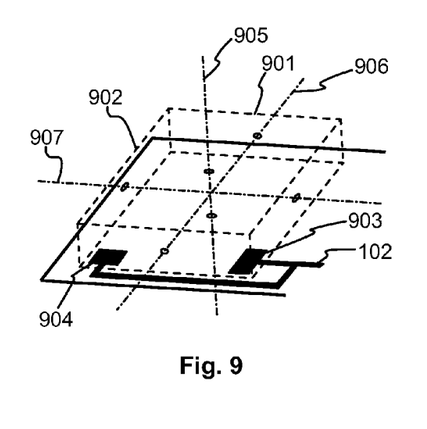
FIG. 9 illustrates two coupling patterns in one conductive pattern.
Figure 10:
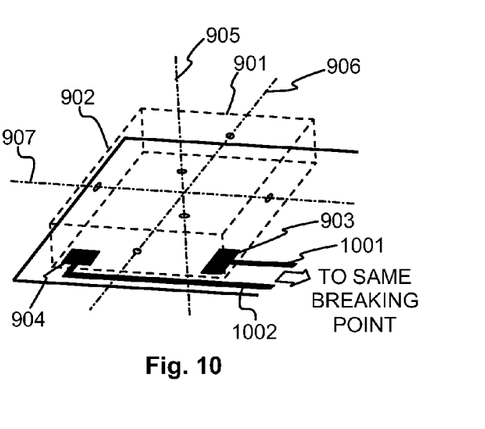
FIG. 10 illustrates two coupling patterns, each with its own conductive pattern.

FIGS. 9 and 10 illustrate how the use of wireless coupling patterns at multiple locations of the interface portion allows considerable freedom in attaching the module to the package. The form of a rectangular module, once attached to the package, is shown with dashed lines. We assume that the large side surfaces of the module are approximately square, i.e. that sides 901 and 902 are essentially equally long. In FIG. 9, the electrically conductive pattern 102 comprises at least two wireless coupling patterns 903 and 904, each of which constitutes one half of a wireless coupling arrangement in the sense that if the module, which will be attached to the package, has a corresponding coupling pattern, it can use it to set up a wireless coupling to the electrically conductive pattern 102 through either of the wireless coupling patterns 903 and 904.

The two wireless coupling patterns 903 and 904 are located differently within the interface portion. In particular, the locations of the wireless coupling patterns 903 and 904 within the interface portion are separated by a 90 degrees turn around an axis 905 of symmetry of the module, which is thus also an axis of symmetry of the interface portion. Assuming that all corresponding electrically conductive patterns on the package, with which the module should set up a wireless short-range communications link, have similarly two wireless coupling patterns within the interface portion, the module can be turned 90 degrees around the axis 905 without affecting the wireless short-range communications. It is clear that if each electrically conductive pattern has even more wireless coupling patterns, even more freedom is given to the orientation of the module when attached to the package.

FIG. 10 illustrates an alternative, in which the package comprises two electrically conductive patterns 1001 and 1002, each of which is configured to behave in the same way as a response to a particular change in the package. For example, each of the two conductive patterns 1001 and 1002 extends to a breaking point where they both will be cut as a response to releasing the same product from the package. Also, beyond the breaking point each of them is coupled to a ground track through a similarly dimensioned impedance element. Each of the two electrically conductive patterns 1001 and 1002 comprises, at least partly within the interface portion, a respective wireless coupling pattern 903 or 904 that constitutes one half of a wireless coupling arrangement. The wireless coupling patterns 903 and 904 are located differently within the interface portion; particularly with a 90 degrees separation around an axis 905 of symmetry of the interface portion.

Depending on how the module-side wireless coupling patterns are implemented, and also depending on how many wireless coupling patterns there are on the package side and how they are located within the interface portion, it may be possible to turn the module around also other axes 906 and 907 of symmetry, particularly in steps of 90 or 180 degrees, without affecting the wireless short-range communications.

Figure 11:
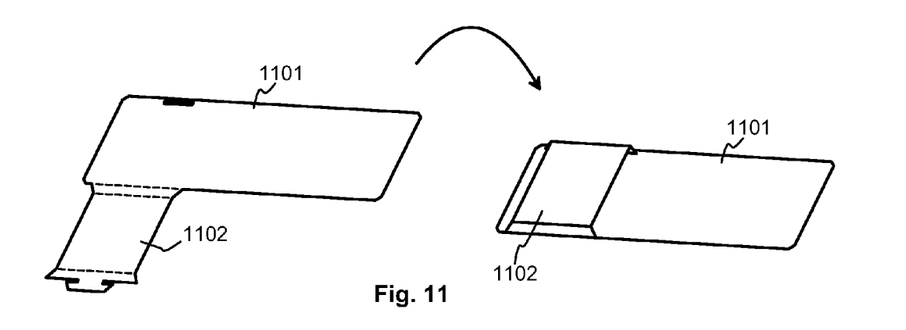
FIG. 11 illustrates one possibility of using a portion of the package to hold the module in place.
Figure 12:
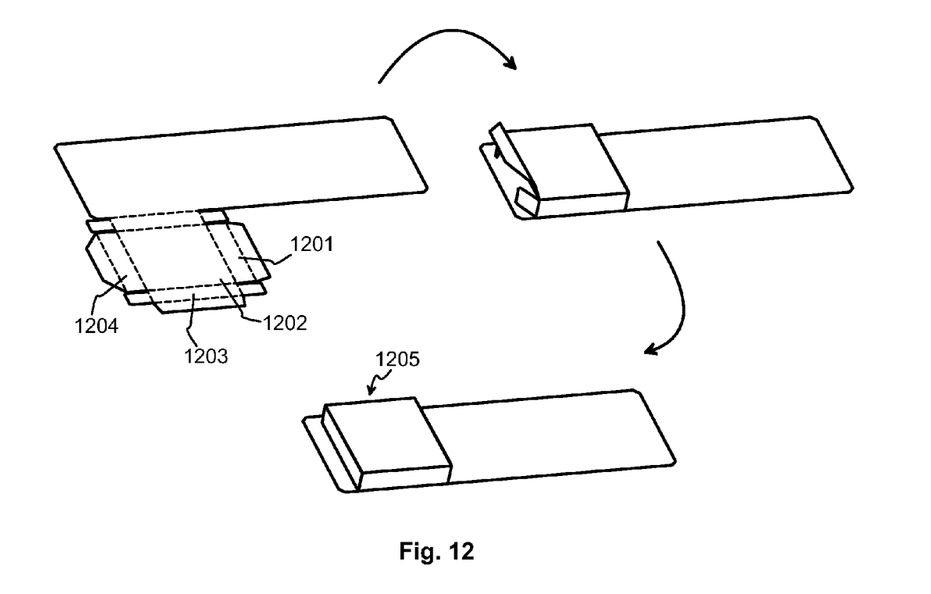
FIG. 12 illustrates another possibility of using a portion of the package to hold the module in place.

FIGS. 11 and 12 illustrate some examples of how an originally planar workpiece of a package body may be bent to constitute a holder for a module that is attached to an interface portion of the package. In FIG. 11 the body comprises a layer of fibrous and/or plastic material that comprises a plane portion 1101 and a bendable portion 1102. In an open configuration, which is shown on the left in FIG. 11, the plane portion 1101 and the bendable portion 1102 are both within the same plane. For example, the workpiece may have originally existed in the form of a cardboard sheet, from which the form illustrated on the left in FIG. 11 has been cut with a die cutter. In a closed configuration, which is shown on the right in FIG. 11, the bendable portion is bent out of the plane of the plane portion to define a module compartment that is limited by at least part of both the plane portion 1101 and the bendable portion 1102.

In the embodiment of FIG. 12 the layer of fibrous or plastic material comprises multiple bendable portions (for example portions 1201, 1202, 1203, and 1204) that in the open configuration are within the same plane as the plane portion. In the closed configuration shown at the bottom of FIG. 12 the bendable portions define, together with at least part of the plane portion, a closed module compartment 1205. At the top right in FIG. 12 is a semi-closed configuration, in which the compartment has been formed but one side of it is still open, so that a module can be slipped in very much like into a box of sweets. This kind of embodiment is a particularly advantageous candidate for an arrangement where multiple wireless coupling patterns at selected locations of the interface portion (i.e. on the inner walls of the compartment) allow slipping the module into the compartment in any orientation in which it fits in without problems.

Figure 13:
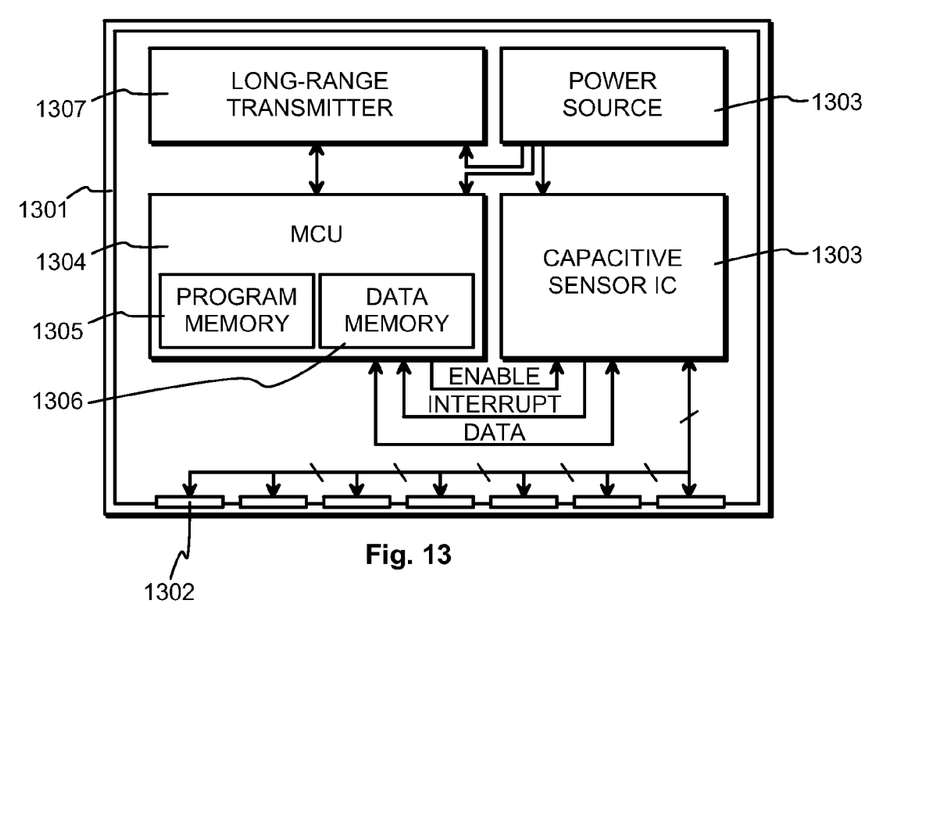
FIG. 13 illustrates an exemplary block diagram of a module.

FIG. 13 is an example of how a block diagram of a communications module for a package may look like. The communications module comprises a module body 1301, and at an outer surface of it, one or more wireless coupling patterns that constitute a half of a wireless coupling arrangement. Wireless coupling pattern 1302 is shown as an example. Saying that the wireless coupling patterns are "at" an outer surface of the communications module emphasizes that they do not need to be exactly on the outer surface, in the sense that they could be touched from outside the module (although that is not excluded either). The wireless coupling patterns may be for example embedded in a surface layer of the module body 1301.

The communications module comprises a sensor of electric characteristics. The sensor is configured to direct an excitation signal to the half of a wireless coupling arrangement constituted by the wireless coupling pattern(s), and to measure a response to the excitation signal. In the embodiment illustrated in FIG. 13 the sensor of electric characteristics appears as a capacitive sensor integrated circuit 1303. For example, a circuit of the type EM6240 of EM Microelectronic, Marin, Switzerland can be used as the capacitive sensor integrated circuit 1303. In particular, the sensor may be configured to direct an oscillating excitation signal to the above-mentioned half of a wireless coupling arrangement and to measure a frequency response to said oscillating excitation signal.

A microcontroller 1304 is responsible for the overall operation of the communications module. It comprises or has its disposal a program memory 1305, into which the method to be executed by the communications module can be stored in the form of machine-readable instructions. The microcontroller 1304 also comprises or has its disposal a data memory 1306, which it may use to store data that accumulates during the operation of the communications module. The microcontroller 1304 is configured to enable the operation of the short-range wireless communications link by giving an enable signal to the capacitive sensor integrated circuit 1303. The last-mentioned is configured to send an interrupt signal to the microcontroller 1304 in case there is something to be reported from the short-range wireless communications link. Data, such as commands and responses, can be transmitted in both directions between the microcontroller 1304 and the capacitive sensor integrated circuit 1303.

The communications module of FIG. 13 comprises a long distance wireless communications transmitter 1307. The microcontroller 1304, which could also be called a processor, is configured to transmit, over the long distance wireless communications transmitter, information indicative of measured responses to excitation signals. This way a distant receiver and data processing unit, such as the computer of a monitoring entity, may receive information about how the products contained in a particular package (to which the communications module has been attached) have been used.

The designation "long distance" is used here as a relative term signifying that the distances over which the long distance wireless transmitter 1307 is expected to communicate are longer than the distances over which the communications module communicates over the short-distance wireless communications interface. Thus even if communications according to e.g. Bluetooth or RFID interfaces may not be typically regarded as long-distance communications, they fall within that category here because the short-distance wireless communications interface is meant for use between two very closely adjacent entities. Other possible forms of long-distance wireless interfaces include, but are not limited to, cellular phone system interfaces, WiFi interfaces, and WLAN interfaces.

Figure 14:
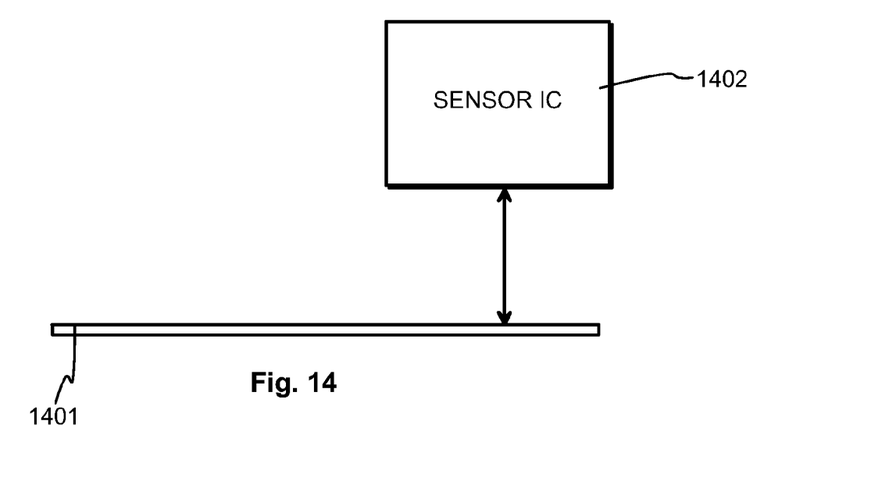
FIG. 14 illustrates an alternative structure of a capacitive sensor and its driver circuit

FIG. 14 illustrates an alternative approach to setting up the module side of the short-range wireless communications link. Instead of the multitude of wireless coupling patterns, of which pattern 1302 was shown as an example in FIG. 13, the arrangement shown in FIG. 14 comprises a single, spatially extended short-range wireless communications interface 1401. The short-range wireless communications interface 1401 may have certain spatial resolution, so that it can be used to set up a short-range wireless communications link with a number of separate wireless coupling patterns on a surface, against which the short-range wireless communications interface 1401 will come. The sensor of electric characters is implemented in the form of an integrated circuit 1402. This combination may be further placed in a communications module much like the combination of the capacitive sensor integrated circuit 1303 and the multitude of wireless coupling patterns illustrated in FIG. 13.

Variations and modifications are possible without departing from the scope defined by the appended claims. For example, even if printing with conductive ink on a base material of a package or part of package (such as label, insert, or other) may be a commonly used solution, the invention does not exclude producing conductive patterns with other methods including, but not being limited to, chemical vapor deposition, atomic layer deposition, etching, laser ablation, metal foil cutting and glueing, and others.

When items are held in a package, it may not always be simple or straightforward to arrange the item-specific electric characteristics so that measuring them, for example by actions of a module attached to the package, would be reliable in all situations. This is especially true when the items do not have well-defined locations within the package at which they could be expected to stay until deliberately removed from the package. As one example we may consider that the "items" are a number of consumer packages that are enclosed in a transport package, from which they will be removed for sale.

Figure 15:
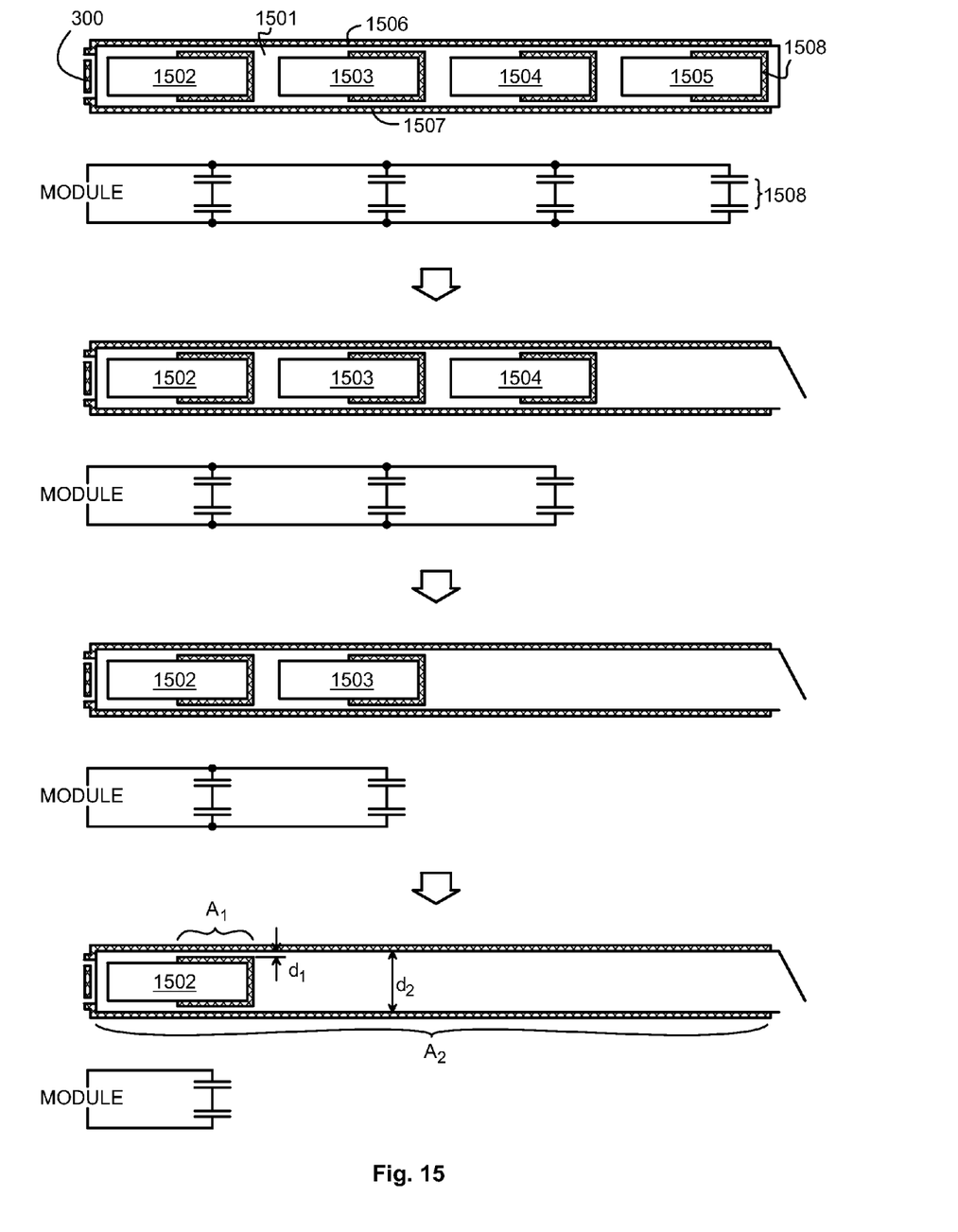
FIG. 15 illustrates electronic coupling patterns on a package and linkage patterns on items.

FIG. 15 illustrates a package system, which comprises a package 1501 and a number of items 1502, 1503, 1504, and 1505 held in said package 1501. We assume, as an example, that the package 1501 is a transport package, in which a number of consumer packages 1502, 1503, 1504, and 1505 are held. A module 300 has been attached to the package 1501, with the objective of storing in the module 300 information about the presence of items in and/or removing of items from the package.

A first electrically conductive pattern 1506 is supported by one side surface of the package 1501. A second electrically conductive pattern 1507 is supported by another surface of the package. In the case illustrated in FIG. 15 the surfaces appear as the top and bottom surfaces of the package, but at least one of the first and second electrically conductive patterns could be also on e.g. the inside of the top and bottom walls of the package, or even laminated within the walls of the package. For a reason that will become apparent below, the first and second electrically conductive patterns could be supported also at least partly on the same surface or wall of the package, but they should be reasonably far apart from each other so that any capacitive and/or inductive coupling between them is small. What is meant by "small" in this respect will also become more apparent below.

At least one electrically conductive linkage pattern is supported by at least one of the items. In the case illustrated in FIG. 15 all four items are similar in this respect, so each of them has an electrically conductive linkage pattern supported by the outer surface of the respective item. Linkage pattern 1508 is shown as an example. One part of the linkage pattern 1508 is adjacent to the first electrically conductive pattern 1506 supported by the package, and another part of the linkage pattern 1508 is adjacent to the second electrically conductive pattern 1507 supported by the package. The module 300 is configured to measure an electric characteristic of a circuit comprising said first and second electrically conductive patterns 1506 and 1507, as well as said linkage pattern 1508.

The mutual locations of the first and second electrically conductive patterns 1506 and 1507 and the linkage pattern 1508 are such that what appears as the upper end of the linkage pattern 1508 is on that surface of the respective item 1505 that, when the item 1505 has been placed normally into the package 1501, comes against that portion of the package 1501 that supports the first electrically conductive pattern 1506. Similarly what appears as the lower end of the linkage pattern 1508 is on that surface of the respective item 1505 that, when the item 1505 has been placed normally into the package 1501, comes against that portion of the package 1501 that supports the second electrically conductive pattern 1507.

Now the distance between the mutually adjacent patterns (i.e. between the first conductive pattern 1506 and the upper end of the linkage pattern 1508, and between the second conductive pattern 1507 and the lower end of the linkage pattern 1508) is much smaller than the distance between the first and second conductive patterns 1506 and 1507. Consequently we may consider each pair of mutually adjacent patterns as a capacitor. The ends of the linkage pattern 1508 on opposite sides of the item 1505 are galvanically coupled to each other, so all in all the linkage pattern constitutes a double capacitance coupling (a coupling where two capacitors are connected in series) between the first and second conductive patterns 1506 and 1507. The double capacitance coupling is illustrated as 1508 in the schematic circuit diagram that describes the most significant electric characteristics of the package 1501 filled with items 1502, 1503, 1504, and 1505.

If we assume that each "component" capacitance, of which a total of eight are shown in the circuit diagram, has a value $C_1$, it is straightforward to show that each double capacitance coupling has a capacitance $C_1/2$ and the total capacitance between the first and second electrically conductive patterns 1506 and 1507 is $2C_1$ when all four items 1502, 1503, 1504, and 1505 are in the package 1501. After one item has been taken out, three items 1502, 1503, and 1504 remain the package as shown in the second portion of FIG. 15. The total capacitance is now $3C_1/2$. Consecutively removing one item after the other causes the total capacitance to decrease in steps of $C_1/2$ until only one item is left, as is shown at the bottom of FIG. 15.

In order for it to be possible for the module to reliably detect the number of remaining items in the passage, the incremental amount of change in capacitance ($C_1/2$) should be large enough compared to the stray capacitance between the first and second electrically conductive patterns 1506 and 1507. Capacitance C is in general related to conductor area A, separating distance d, and medium relative permittivity $\epsilon_r$ according to the formula $C=\epsilon_r\epsilon_0 A/d$, where $\epsilon_0$ is the permittivity of vacuum.

We may consider the question of conductor area and make the following two assumptions: 1) the distance $d_2$ between the first and second electrically conductive patterns 1506 and 1507 is for example twenty times the distance $d_1$ between one of them and the closest end of a linkage pattern, i.e. $d_2=20d_1$, and 2) the overlapping conductor area in one "capacitor" formed between the package and an item is $A_1$, while the overlapping conductor area between the first and second conductive patterns is $A_2$. With these exemplary assumptions the ratio of $C_1/2$ over $C_2$ (i.e. the ratio of the incremental amount of change in capacitance over the stray capacitance between the first and second electrically conductive patterns 1506 and 1507) then makes $10\times A_1/A_2$, from which it is easy to see that if we require $C_1/2$ to be e.g. five times $C_2$, we must require $A_1>A_2/2$.

Figure 16:
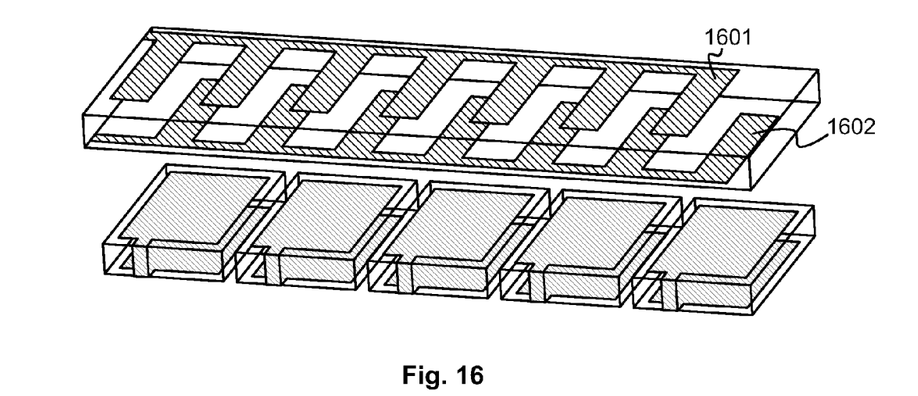
FIG. 16 illustrates an alternative way of placing electronic coupling patterns on a package and linkage patterns.

In order not to require the linkage pattern area to be excessively large in relation to the overall surface area of an item, the basic idea illustrated above can be varied in terms of how the electrically conductive areas are dimensioned and designed. FIG. 16 illustrates one alternative principle, namely making the first and second electrically conductive patterns comprise two-dimensional patches or areas separated by empty spaces. The patches of the first electrically conductive pattern 1601 are aligned with the empty spaces left by the second electrically conductive pattern 1602, and vice versa.

The general principle that was illustrated in FIG. 15 involves the inherent advantage that the magnitude of the capacitive coupling that each item represents, while still inside the package, is not dependent on the exact location of the item. After at least one item has been taken out of the package, the remaining items may be left with some empty space around them, so that they can slide back and forth. However, assuming that the conductive patterns are conductive enough so that resistive losses can be ignored, the possible movements of the items have no effect on measuring the overall capacitance.

If this advantageous feature is to be maintained in an arrangement following the principle of FIG. 16, one possibility is to make the dimension of the linkage patterns in the possible moving direction(s) larger than the width in that direction of the gaps in the electrically conductive patterns. FIG. 16 shows an example, in which the linkage pattern on each item is essentially as wide in the longitudinal direction of the package as one conductive patch and its adjacent empty space together. This way the overlapping area that is common to the conductive pattern and the linkage pattern remains constant irrespective of any longitudinal movement of the item inside the package.

Figure 17:
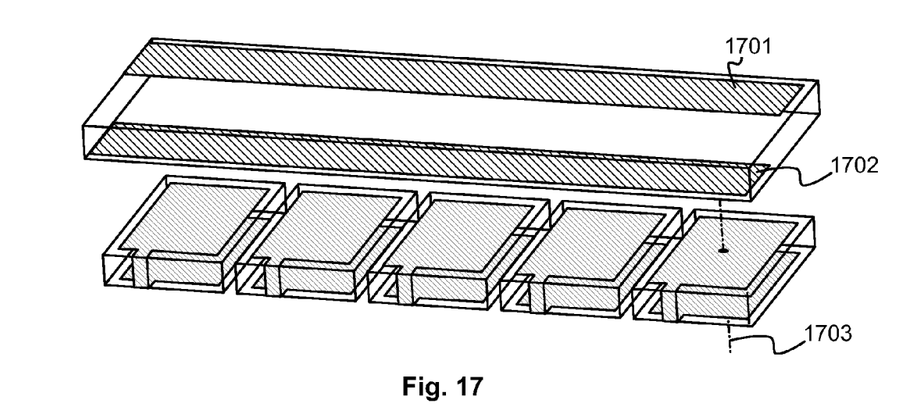
FIG. 17 illustrates another alternative way of placing electronic coupling patterns on a package and linkage patterns.

FIG. 17 shows another alternative principle, in which each of the first and second conductive patterns 1701 and 1702 is continuous in the longitudinal direction of the package, but they are located at non-overlapping parts of the top and bottom surfaces of the package. If, as is shown in FIG. 17, the linkage patterns have sufficient coverage on the top and bottom surfaces of the items, it is of no importance to the capacitive coupling whether or not an item rotates around the rotation axis 1703 while still inside the package.

Figure 18:
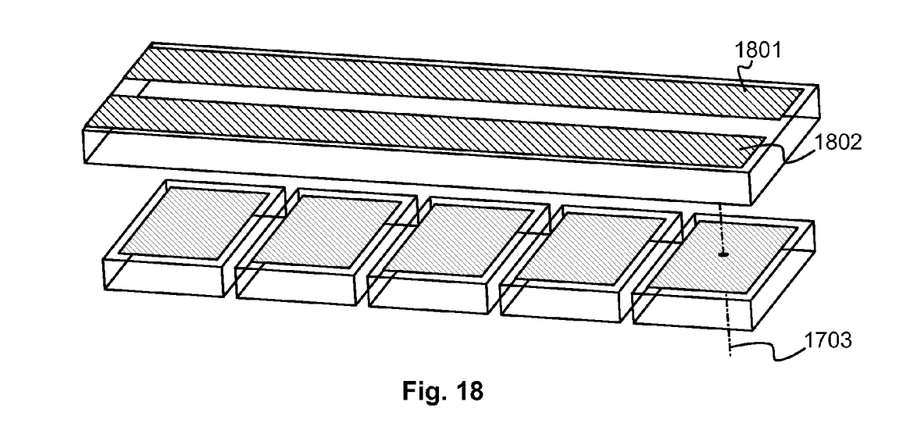
FIG. 18 illustrates yet another alternative way of placing electronic coupling patterns on a package and linkage patterns.

FIG. 18 shows yet another alternative principle, in which each of the first and second conductive patterns 1801 and 1802 are on the same surface of the package. In this case also the items are only required to have the linkage pattern prepared on one side, which most advantageously is that side that comes against that side of the package that supports the first and second conductive patterns 1801 and 1802. Again, sufficient coverage of the linkage pattern may be used to provide immunity against similar rotation of the items as above in FIG. 17: for example a conductive patch, which covers the most of that side of the item that comes against that side of the package where the first and second conductive patterns are, makes sure that the rotational position of the item around an axis 1703 does not affect the coupling.

In the graphical illustration provided in FIGS. 16, 17, and 18 it is assumed that the package is equipped with a communications module that has the necessary couplings to the first and second conductive patterns on the package. The module could be located for example on or close to the left end of the package in the position shown in the drawings. As such, the principle of having capacitive couplings between conductive patterns of the package and linkage patterns on the items is not sensitive to whether the coupling between the conductive patterns of the package and the module is capacitive or has some other form, like galvanic, inductive, or other.

We may assume that while the items are still inside the package (for example when consumer packages are still inside a transport package), it is not necessary to equip them with communications modules of their own—although that is not excluded either. We may also assume that at least in some cases it may be advantageous to equip an item (like a consumer package) with a communications module of its own once it has been removed from the (transport) package. If the items are consumer packages or other kinds of smaller packages, which in turn include items the removing of which should be monitored, we may have a "nested" system: the linkage pattern on an item, as illustrated in FIGS. 15 to 18, may actually consist of electrically conductive patterns that the communications module, which will eventually be attached to that item, in turn uses to detect the removing of smaller items from inside that item.

What is claimed is:

1. A package, comprising:
a body,
an electrically conductive pattern supported by said body,
an interface portion configured to receive a module to a removable attachment with said package,
wherein said electrically conductive pattern comprises, at least partly within said interface portion, a wireless coupling pattern that constitutes one half of a wireless coupling arrangement,
a ground track that is supported by said body and comprises a ground coupling pattern located at least partly within said interface portion,
an impedance element coupled between said electrically conductive pattern and said ground track, and
a breakable portion of said electrically conductive pattern; wherein said breakable portion is located between the wireless coupling pattern and said impedance element.

2. A package according to claim 1, wherein said wireless coupling pattern is one of: a capacitive coupling patch, an inductive coupling loop.

3. A package according to claim 2,
wherein said at least parts of the ground coupling pattern and the wireless coupling pattern are located at opposite ends of the interface portion.

4. A package according to claim 1, wherein said impedance element is a capacitance.

5. A package according to claim 1, wherein said breakable portion extends across a perforation in said body.

6. A package according to claim 1, wherein said breakable portion extends across a breakable wall of a compartment defined by said body.

7. A package according to claim 1, wherein:
said electrically conductive pattern comprises at least two wireless coupling patterns,
each of said at least two wireless coupling patterns constitutes one half of a wireless coupling arrangement, and
said at least two wireless coupling patterns are located differently within said interface portion.

8. A package according to claim 1, wherein:
the package comprises two electrically conductive patterns, each of which is configured to behave in the same way as a response to a particular change in the package,
each of said two electrically conductive patterns comprises, at least partly within said interface portion, a respective wireless coupling pattern that constitutes one half of a wireless coupling arrangement, and
said wireless coupling patterns are located differently within said interface portion.

9. A package according to claim 7, wherein:
the locations of said wireless coupling patterns within said interface portion are separated by 90 or 180 degrees turns around an axis of symmetry of said interface portion.

10. A package according to claim 1, wherein:
said body comprises a layer of fibrous or plastic material that comprises a plane portion and a bendable portion,
in an open configuration said plane portion and said bendable portion are both within the same plane, and
in a closed configuration said bendable portion is bent out of the plane of said plane portion to define a module compartment limited by at least part of both said plane portion and said bendable portion.

11. A package according to claim 10, wherein:
said layer of fibrous or plastic material comprises multiple bendable portions that in said open configuration are within the same plane as said plane portion,
in said closed configuration said bendable portions define, together with at least part of said plane portion, a closed module compartment.

12. A package according to claim 4, wherein said breakable portion extends across a perforation in said body.

13. A package according to claim 4, wherein said breakable portion extends across a breakable wall of a compartment defined by said body.

14. A package according to claim 2, wherein:
said electrically conductive pattern comprises at least two wireless coupling patterns,
each of said at least two wireless coupling patterns constitutes one half of a wireless coupling arrangement, and
said at least two wireless coupling patterns are located differently within said interface portion.

15. A package according to claim 3, wherein:
said electrically conductive pattern comprises at least two wireless coupling patterns, each of said at least two wireless coupling patterns constitutes one half of a wireless coupling arrangement, and said at least two wireless coupling patterns are located differently within said interface portion.

\* \* \* \* \*